United States Patent
Baskett

(10) Patent No.: US 7,129,781 B2
(45) Date of Patent: Oct. 31, 2006

(54) HIGH SLEW ECL DEVICE AND METHOD THEREFOR

(75) Inventor: Ira E. Baskett, Tempe, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 60 days.

(21) Appl. No.: 11/009,585

(22) Filed: Dec. 13, 2004

(65) Prior Publication Data

US 2006/0125561 A1    Jun. 15, 2006

(51) Int. Cl.
*H03F 3/45* (2006.01)
(52) U.S. Cl. ................................... 330/252; 330/302
(58) Field of Classification Search ............. 330/252, 330/302

See application file for complete search history.

(56) References Cited

U.S. PATENT DOCUMENTS

| | | | | | |
|---|---|---|---|---|---|
| 5,477,190 | A | * | 12/1995 | Brehmer et al. | 330/253 |
| 5,521,555 | A | * | 5/1996 | Tazartes et al. | 330/308 |
| 5,990,737 | A | * | 11/1999 | Czarnul et al. | 330/69 |
| 6,580,325 | B1 | * | 6/2003 | Aude | 330/260 |
| 6,882,226 | B1 | * | 4/2005 | Cho et al. | 330/282 |

OTHER PUBLICATIONS

"An Outline of Design Techniques for Linear Integrated Circuits", by Hans R. Camenzind and Alan B. Grebene, IEEE Journal of Solid State Circuits, vol. SC-4, No. 3, Jun. 1969, pp. 110-122.

* cited by examiner

*Primary Examiner*—Patricia Nguyen
(74) *Attorney, Agent, or Firm*—Robert F. Hightower

(57) ABSTRACT

In one embodiment, an ECL logic device uses a capacitor to couple a positive voltage to an output and reduce the rise time of the output signal.

20 Claims, 2 Drawing Sheets

HIGH SLEW ECL DEVICE AND METHOD THEREFOR

BACKGROUND OF THE INVENTION

The present invention relates, in general, to electronics, and more particularly, to methods of forming semiconductor devices and structure.

In the past, the electronics industry utilized various methods and structures to produce high speed ECL logic devices. ECL logic devices typically used a differential amplifier with a differential transistor pair that had the two transistors of the differential pair connected to a power supply through collector resistors. Thus, the differential amplifier had a passive pull-up and an active pull-down. As a result, the rising edge of the output signal was slower than the falling edge. The difference between the rise and fall times caused jitter and noise in the output signal of the logic device. In some applications, the jitter resulted in timing differences that slowed the operation of the system using the logic device.

Accordingly, it is desirable to have a method of forming a logic device that provides more closely matched rise and fall times, that reduces jitter, and that facilitates increased system operating frequencies.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain NPN devices, a person of ordinary skill in the art will appreciate that complementary devices are also possible in accordance with the present invention.

DETAILED DESCRIPTION OF THE DRAWINGS

Figure 1:
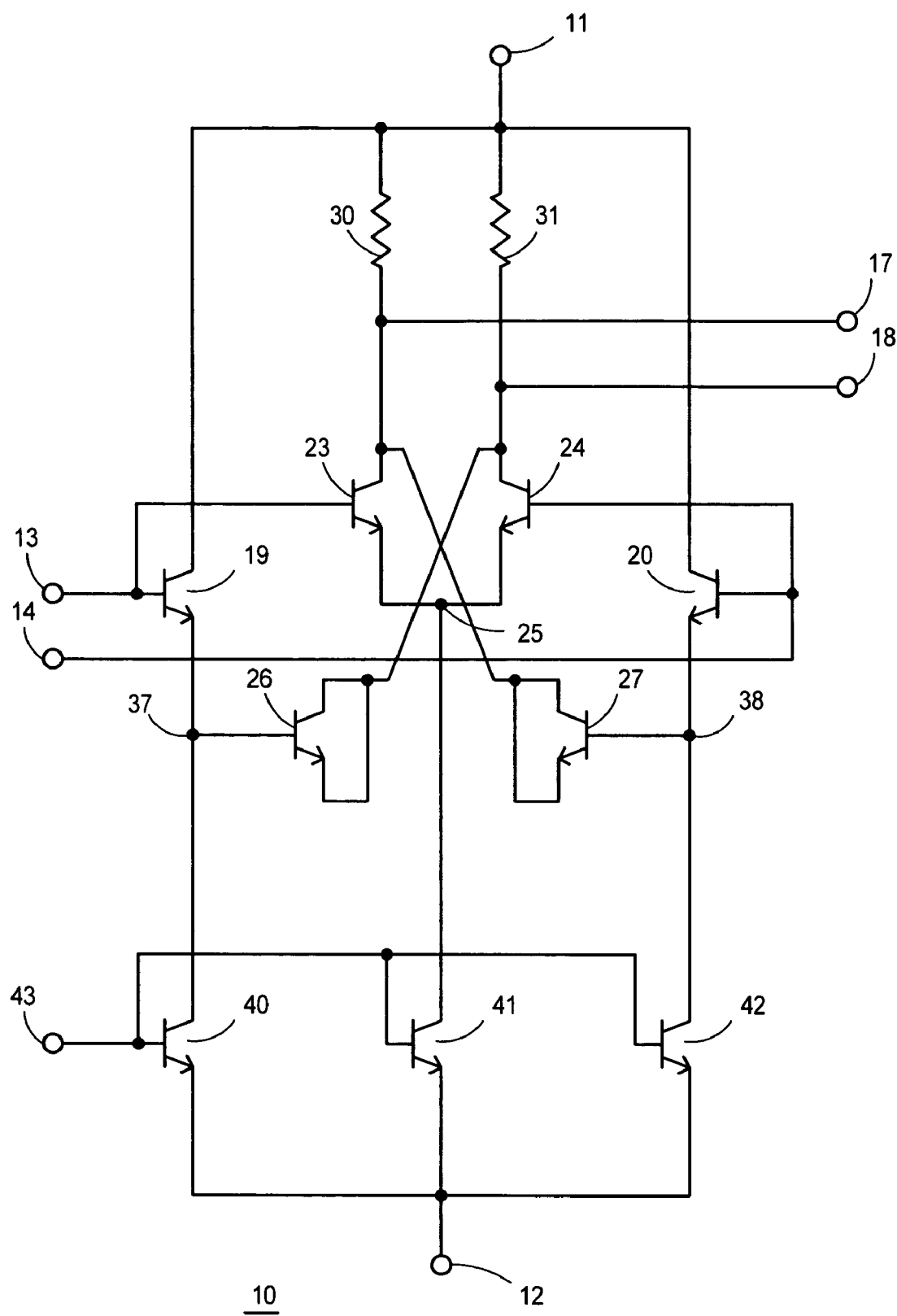
FIG. 1 schematically illustrates an embodiment of a portion of a logic device in accordance with the present invention.

FIG. 1 schematically illustrates an embodiment of a portion of an ECL logic device 10 that operates from low power supply voltages and that has more closely matched rise and fall times. Transistors 23 and 24 are configured as a differential pair of a differential amplifier of device 10. The differential amplifier also includes respective collector resistors 30 and 31 that couple transistors 23 and 24 to receive a power supply voltage. Device 10 receives the power supply voltage between a power input terminal 11 and a power return terminal 12. The differential amplifier also includes current sources 40, 41, and 42, buffer transistors 19 and 20, and capacitor coupled transistors 26 and 27. Transistors 23 and 24 are configured to receive input signals that are received on respective inputs 13 and 14 of device 10, and responsively form output signals on respective outputs 17 and 18. Current source 41 biases transistors 23 and 24 to form a common mode output voltage for the output signals on outputs 17 and 18. The output signals swing around the common mode voltage. Current sources 40 and 42 form similar bias currents for respective transistors 19 and 20. Sources 40, 41, and 42 are configured to receive a bias voltage on a bias input 43 and responsively form the bias currents.

As the voltage of the input signal on input 13 increases, transistor 23 increases current conduction and lowers the voltage on output 17. As the signal on input 13 increases, the voltage of the corresponding signal on input 14 decreases which decreases current conduction through transistor 24 allowing resistor 31 to pull output 18 toward the value of the voltage on terminal 11. The signal on input 13 also causes transistor 19 to increase conduction and couple current into the base of transistor 26. Since transistor 26 is coupled as a capacitor, the increased current induces a large positive voltage spike on output 18 which quickly increases the voltage of the signal on output 18. Thus, the capacitor of transistor 26 receives a signal that is representative of the input signal and capacitively couples the signal to output 18 to rapidly increase the voltage of the output signal. While the input signal on input 14 is decreasing, transistor 20 decreases conduction and reduces the current coupled to transistor 27. Since transistor 27 is also coupled as a capacitor, the decreased current induces a large negative voltage spike to output 17. The negative voltage spike has little effect on output 17 because transistor 23 is actively pulling output 17 to a lower voltage. As can be seen, using the capacitor formed by transistor 26 to couple the positive voltage spike to output 18 reduces the rise time of the output signal. In most embodiments, the capacitor reduces the rise time to a value approximately equal to the active fall time of the output signal. Transistor 19 buffers the base of transistor 23 from the capacitance of transistor 26 thereby preventing the capacitance of transistor 26 from slowing the response time of transistor 23.

Transistor 20 and capacitor coupled transistor 27 function similarly to respective transistors 19 and 26. As transistor 20 increases conduction, an increased current is coupled to the capacitor which responsively induces a positive voltage spike on output 17. The voltage spike quickly increases the voltage of the output signal and reduces the rise time of the output signal. Transistor 20 buffers the base of transistor 24 from the capacitance of transistor 27 thereby preventing the capacitance of transistor 27 from slowing the response time of transistor 24.

In one example embodiment, transistors 19, 20, 26, and 27 decreased the rise time of the output signals on outputs 17 and 18 by at least approximately twenty percent (20%) resulting in a rise time that was approximately equal to the fall time.

In order to facilitate the above functionality, a first terminal of both resistors 30 and 31 is connected to terminal 11 and is also commonly connected to a collector of transistor 19 and a collector of transistor 20. An emitter of transistor 19 is commonly connected to the base of transistor 26 and a collector of transistor 40. A base of transistor 19 is connected to input 13 and to a base of transistor 23. A collector and an emitter of transistor 26 are commonly connected to a collector of transistor 24, output 18, and a second terminal of resistor 31. An emitter of transistor 24 is commonly connected to node 25, an emitter of transistor 23, and a collector of transistor 41. A base of transistor 24 is connected to the base of transistor 20 and to input 14. An emitter of transistor 20 is connected to a base of transistor 27 and to a collector of transistor 42. A collector and an emitter of transistor 27 is commonly connected to output 17 and a second terminal of resistor 30. A base of transistors 40, 41, and 42 is connected to bias input 43, and an emitter of transistors 40, 41 and 42 is connected to terminal 12.

Figure 2:
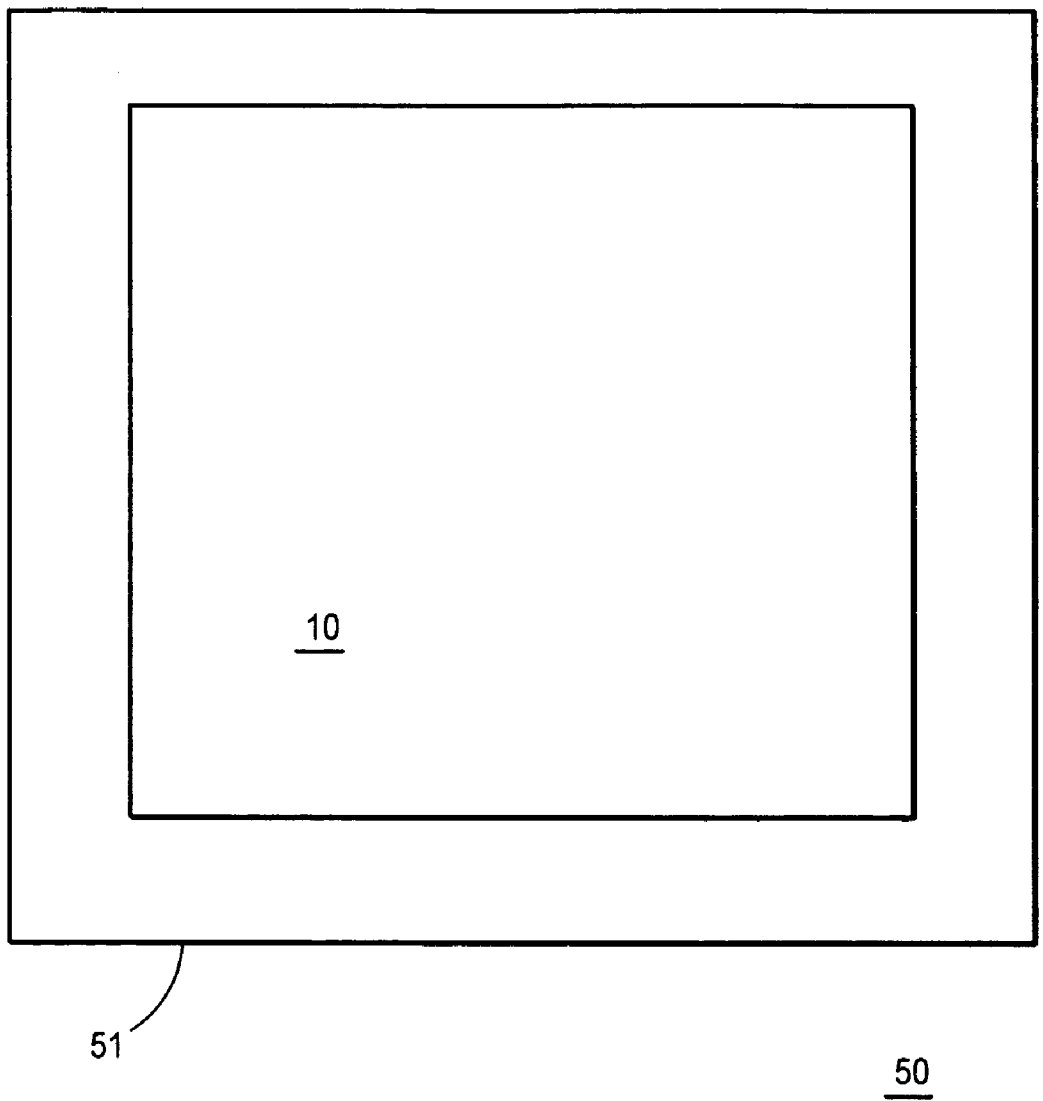
FIG. 2 schematically illustrates an enlarged plan view of a semiconductor device that includes the logic device of FIG. 1 in accordance with the present invention.

FIG. 2 schematically illustrates an enlarged plan view of a portion of an embodiment of a semiconductor device 50 that is formed on a semiconductor die 51. Device 10 is formed on die 51. Die 51 may also include other circuits that are not shown in FIG. 2 for simplicity of the drawing. Device 10 is formed on die 51 by semiconductor manufacturing techniques that are well known to those skilled in the art.

In view of all of the above, it is evident that a novel device and method is disclosed. Included, among other features, is using a capacitor to couple an input signal from an input of a differential amplifier to an output of the differential amplifier while isolating the input of the differential amplifier from the capacitor.

While the invention is described with specific preferred embodiments, it is evident that many alternatives and variations will be apparent to those skilled in the semiconductor arts. More specifically the invention has been described for a particular NPN transistor structure, although the method is directly applicable to other bipolar transistors, as well as to MOS, BiCMOS, metal semiconductor FETs (MESFETs), HFETs, and other transistor structures. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A differential amplifier comprising:
   a first transistor having a first current carrying electrode coupled to a first output of the differential amplifier, a second current carrying electrode, and a control electrode coupled to receive a first input signal;
   a second transistor having a first current carrying electrode coupled to a second output of the differential amplifier, a second current carrying electrode coupled to the second current carrying electrode of the first transistor, and a control electrode coupled to receive a second input signal;
   a third transistor having a control electrode coupled to receive the first input signal, a first current carrying electrode, and a second current carrying electrode;
   a first capacitor having a first terminal coupled to the second current carrying electrode of the third transistor, and a second terminal coupled to the first current carrying electrode of the second transistor;
   a fourth transistor having a control electrode coupled to receive the second input signal, a first current carrying electrode, and a second current carrying electrode; and
   a second capacitor having a first terminal coupled to the second current carrying electrode of the fourth transistor, and a second terminal coupled to the first current carrying electrode of the first transistor.

2. The differential amplifier of claim 1 wherein the first current carrying electrode of the first transistor and the first current carrying electrode of the second transistor are coupled to receive a power supply voltage.

3. The differential amplifier of claim 2 wherein the first current carrying electrode of the first transistor is coupled to receive the power supply voltage through a first resistor.

4. The differential amplifier of claim 3 wherein the first current carrying electrode of the second transistor is coupled to receive the power supply voltage through a second resistor.

5. The differential amplifier of claim 1 wherein the second current carrying electrode of the first transistor and the second current carrying electrode of the second transistor are operably coupled to a first current source.

6. The differential amplifier of claim 1 wherein the second current carrying electrode of the third transistor is operably coupled to a second current source.

7. The differential amplifier of claim 1 wherein the second current carrying electrode of the fourth transistor is operably coupled to a third current source.

8. A method of forming a differential amplifier comprising:
   configuring a first transistor of a differential pair of a differential amplifier to receive a first input signal and responsively couple a first output signal to a first output;
   configuring a second transistor of the differential pair to receive a second input signal and responsively couple a second output signal to a second output; and
   configuring a first capacitor to couple a first signal that is representative of the first input signal to the second output.

9. A method of forming a differential amplifier comprising:
   configuring a first transistor of a differential pair of a differential amplifier to receive a first input signal; and
   configuring a first capacitor to couple a first signal that is representative of the first input signal to a first output of the differential amplifier wherein the first capacitor is isolated from an input of the first transistor including coupling a first terminal of the first capacitor to a first current carrying electrode of a second transistor of the differential pair and coupling a second terminal of the first capacitor to a third transistor that is not one of the differential pair.

10. The method of claim 9 wherein coupling the second terminal of the first capacitor to the third transistor that is not one of the differential pair includes coupling the second terminal of the first capacitor to a first current carrying electrode of the third transistor, coupling a second current carrying electrode of the third transistor to receive a power supply input, and coupling a control electrode of the third transistor to receive the first input signal.

11. The method of claim 9 further including coupling a second current carrying electrode of the second transistor of the differential pair to a first current carrying electrode of the first transistor of the differential pair.

12. The method of claim 11 further including coupling a first terminal of a second capacitor to a second currentcarrying electrode of the first transistor wherein the second capacitor is isolated from the second transistor of the differential pair.

13. The method of claim 9 further including configuring the second transistor of the differential pair to receive a second input signal and configuring a second capacitor to couple a second signal that is representative of the second input signal to a second output of the differential amplifier wherein the second capacitor is isolated from an input of the second transistor.

14. The method of claim 13 wherein configuring thesecond capacitor to couple the second signal that isrepresentative of the second input signal to the second output of the differential amplifier includes coupling a first terminal of the second capacitor to a first currentcarrying electrode of the first transistor and coupling a second terminal of the second capacitor to a fourth transistor that is not one of the differential pair.

15. The method of claim 14 wherein coupling the first terminal of the second capacitor to the first current carrying electrode of the first transistor and coupling the second terminal of the second capacitor to the fourth transistor that is not one of the differential pair includes coupling the second terminal of the second capacitor to a first current carrying electrode of the fourth transistor and coupling a second current carrying electrode of the fourth transistor to receive a power supply voltage.

16. The method of claim 15 further including coupling a control electrode of the fourth transistor to receive the second input signal.

17. A method of forming a differential amplifier comprising:
configuring a differential amplifier to receive a first input signal on a first input and responsively form a first output signal on a first output, and receive a second input signal on a second input and responsively form a second output signal on a second output; and
configuring the differential amplifier to capacitively couple a first signal representative of the first input signal to the second output and to buffer the first signal from the first input signal.

18. The method of claim 17 wherein configuring thedifferential amplifier to capacitively couple the first signal representative of the first input signal to the second output and to buffer the first signal from the first input signal includes coupling a buffer transistor to receive the first input signal, responsively form the first signal, and couple the first signal to a first terminal of a first capacitor.

19. The method of claim 17 further including configuring the differential amplifier to capacitively couple a second signal representative of the second input signal to the first output and to buffer the second signal from the second input signal.

20. The method of claim 19 wherein configuring thedifferential amplifier to capacitively couple the second signal representative of the second input signal to the first output and to buffer the second signal from thesecond input signal includes coupling a buffer transistor to receive the second input signal, responsively form the second signal, and couple the second signal to a first terminal of a capacitor.

* * * * *